US012563776B2

(12) United States Patent
Xie et al.

(10) Patent No.: US 12,563,776 B2
(45) Date of Patent: Feb. 24, 2026

(54) FORMING SOURCE/DRAIN CONTACT IN A TIGHT TIP-TO-TIP SPACE

(71) Applicant: INTERNATIONAL BUSINESS MACHINES CORPORATION, Armonk, NY (US)

(72) Inventors: Ruilong Xie, Niskayuna, NY (US); Andrew Gaul, Halfmoon, NY (US); Andrew M. Greene, Slingerlands, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 18/296,397

(22) Filed: Apr. 6, 2023

(65) Prior Publication Data

US 2024/0339509 A1    Oct. 10, 2024

(51) Int. Cl.
| | |
|---|---|
| *H10D 30/67* | (2025.01) |
| *H10D 84/01* | (2025.01) |
| *H10D 84/03* | (2025.01) |
| *H10D 84/83* | (2025.01) |
| *H10D 30/01* | (2025.01) |
| *H10D 30/43* | (2025.01) |
| *H10D 62/10* | (2025.01) |

(52) U.S. Cl.
CPC ....... *H10D 30/6729* (2025.01); *H10D 84/013* (2025.01); *H10D 84/0147* (2025.01); *H10D 84/038* (2025.01); *H10D 84/83* (2025.01); *H10D 30/014* (2025.01); *H10D 30/43*

(2025.01); *H10D 30/6735* (2025.01); *H10D 30/6757* (2025.01); *H10D 62/121* (2025.01)

(58) Field of Classification Search
CPC ............ H10D 30/6729; H10D 84/013; H10D 84/0149
See application file for complete search history.

(56) References Cited

U.S. PATENT DOCUMENTS

| | | | |
|---|---|---|---|
| 9,847,390 B1 | 12/2017 | Xie | |
| 10,032,912 B2 | 7/2018 | Morin | |
| 10,236,218 B1 | 3/2019 | Xie | |
| 10,373,875 B1 | 8/2019 | Ruilong | |
| 10,804,398 B2 | 10/2020 | Frougier | |
| 10,840,345 B2 | 11/2020 | Greene | |
| 11,227,923 B2 | 1/2022 | Xie | |
| 11,362,194 B2 | 6/2022 | Reznicek | |
| 11,387,331 B2 | 7/2022 | Fang | |
| 2021/0343600 A1 | 11/2021 | Chen | |
| 2022/0262911 A1* | 8/2022 | Yeong | ................... H10D 30/797 |

* cited by examiner

*Primary Examiner* — Fernando L Toledo
*Assistant Examiner* — Adam S Bowen
(74) *Attorney, Agent, or Firm* — Yuanmin Cai

(57) ABSTRACT

Embodiments of present invention provide a semiconductor structure. The semiconductor structure includes a first transistor having a first source/drain region and a second transistor having a second source/drain region; a first source/drain contact around the first source/drain region and a second source/drain contact around the second source/drain region; and a dielectric filler between the first source/drain contact and the second source/drain contact, wherein the dielectric filler has a first portion on top of a second portion, sidewalls of the first portion of the dielectric filler being linearly tapered to result in a width at a top of the first portion being larger than a width at a bottom of the first portion. A method of forming the same is also provided.

20 Claims, 9 Drawing Sheets

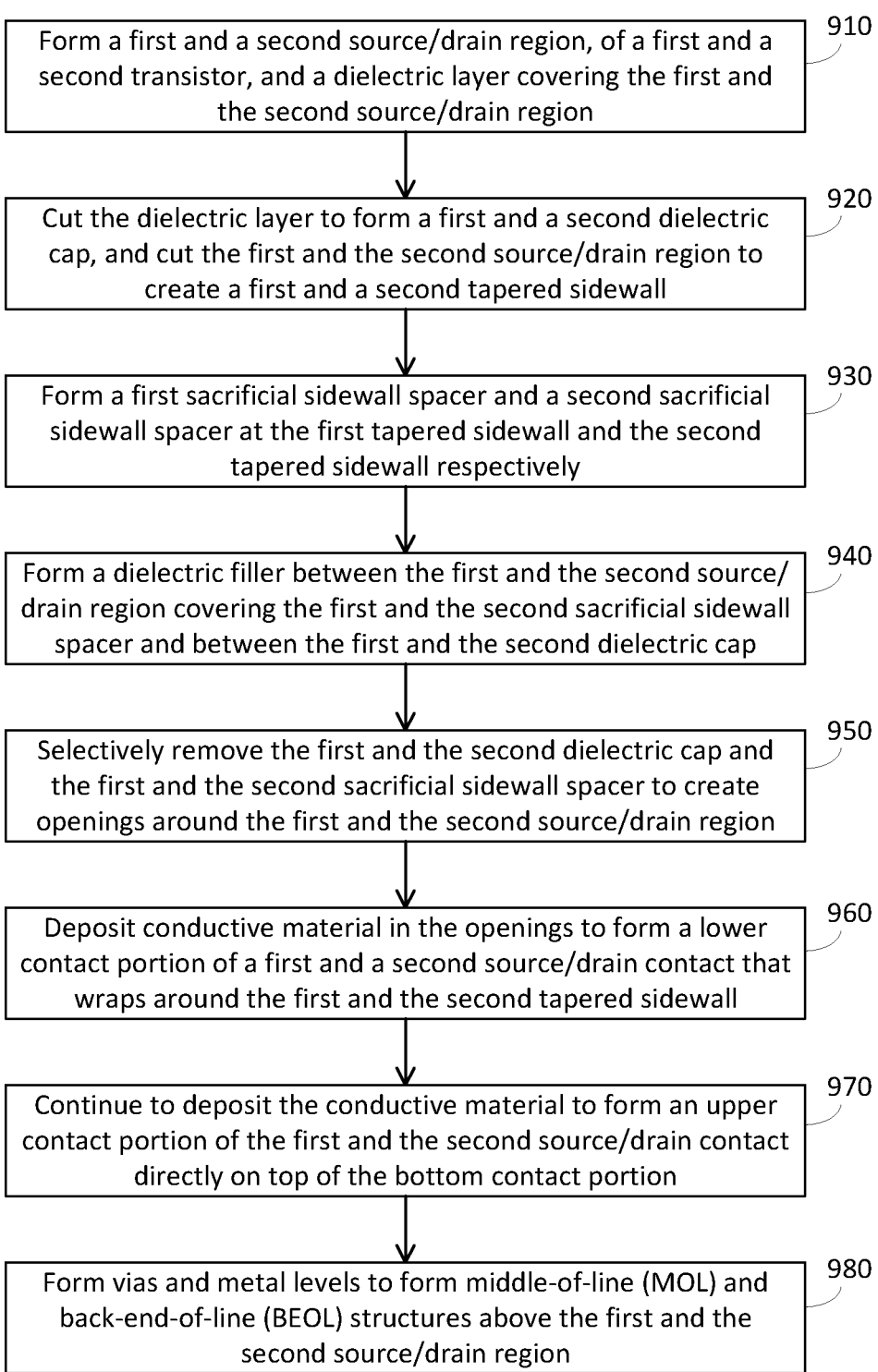

910 Form a first and a second source/drain region, of a first and a second transistor, and a dielectric layer covering the first and the second source/drain region 920 Cut the dielectric layer to form a first and a second dielectric cap, and cut the first and the second source/drain region to create a first and a second tapered sidewall 930 Form a first sacrificial sidewall spacer and a second sacrificial sidewall spacer at the first tapered sidewall and the second tapered sidewall respectively 940 Form a dielectric filler between the first and the second source/drain region covering the first and the second sacrificial sidewall spacer and between the first and the second dielectric cap 950 Selectively remove the first and the second dielectric cap and the first and the second sacrificial sidewall spacer to create openings around the first and the second source/drain region 960 Deposit conductive material in the openings to form a lower contact portion of a first and a second source/drain contact that wraps around the first and the second tapered sidewall 970 Continue to deposit the conductive material to form an upper contact portion of the first and the second source/drain contact directly on top of the bottom contact portion 980 Form vias and metal levels to form middle-of-line (MOL) and back-end-of-line (BEOL) structures above the first and the second source/drain region

FIG. 9

FORMING SOURCE/DRAIN CONTACT IN A TIGHT TIP-TO-TIP SPACE

BACKGROUND

The present application relates to manufacturing of semiconductor integrated circuits. More particularly, it relates to a method of forming source/drain contact of a semiconductor transistor and the structure formed thereby.

With the continued scaling of semiconductor transistors and increased demand for device density, it becomes increasingly important to form properly structured source/drain contacts for transistors that are tightly spaced. For example, because of the small spacing between transistors that are next to each other, source/drain contacts of the transistors that are formed through a conventional damascene process are generally able to contact only the top portion of the underneath source/drain regions of the transistors. Even using a currently known contact-cut process, source/drain contacts formed thereby may only have a very small volume of contact material contacting a portion of sidewalls of the source/drain regions. In all above cases, the source/drain contacts may not have sufficient contact surfaces that may interact with the underneath source/drain regions properly, resulting in degraded device performance such as, for example, increased contact resistance.

SUMMARY

Embodiments of present invention provide a semiconductor structure. The semiconductor structure includes a first transistor having a first source/drain region and a second transistor having a second source/drain region; a first source/drain contact around the first source/drain region and a second source/drain contact around the second source/drain region; and a dielectric filler between the first source/drain contact and the second source/drain contact, wherein the dielectric filler has a first portion and a second portion with the first portion being on top of the second portion, sidewalls of the first portion of the dielectric filler being linearly tapered to result in a width at a top of the first portion being larger than a width at a bottom of the first portion. The larger width at the top of the first portion of the dielectric filler enables forming source/drain contacts more densely without causing short between the source/drain contacts.

In one embodiment, sidewalls of the second portion of the dielectric filler are linearly tapered to result in a width at a top of the second portion being larger than a width at a bottom of the second portion.

In another embodiment, a sidewall of the first portion of the dielectric filler at a first side of the dielectric filler is substantially parallel to a sidewall of the second portion of the dielectric filler at the first side of the dielectric filler.

In yet another embodiment, the width at the bottom of the first portion of the dielectric filler is larger than the width at the top of the second portion of the dielectric filler.

In one embodiment, the first source/drain contact includes a bottom contact portion and a top contact portion directly on top of the bottom contact portion, the bottom contact portion wrapping around sidewalls and a top surface of the first source/drain region of the first transistor. By wrapping around sidewalls and the top surface of the first source/drain region, the first source/drain contact has a larger contact surface to the first source/drain region, resulting a reduced contact resistance and better device performance of the first transistor.

In another embodiment, a portion of the bottom contact portion contacting sidewalls of the first source/drain region of the first transistor is substantially conformal. This helps improve contact resistance uniformity of the first source/drain contact.

In yet another embodiment, the top contact portion has a width at a top thereof that is narrower than a width at a bottom thereof. A narrower width at the top of the top contact portion helps forming source/drain contacts more densely without causing short in-between.

In a further embodiment, the sidewalls of the first source/drain region of the first transistor are flat and tapered.

Embodiments of present invention also provide a method of forming semiconductor devices. The method includes forming a first source/drain region of a first transistor and a second source/drain region of a second transistor, the second source/drain region being next to the first source/drain region; cutting the first source/drain region to create a first tapered sidewall and the second source/drain region to create a second tapered sidewall, the second tapered sidewall facing the first tapered sidewall; forming a first sacrificial sidewall spacer at the first tapered sidewall and a second sacrificial sidewall spacer at the second tapered sidewall; and forming a first source/drain contact of the first transistor and a second source/drain contact of the second transistor, a lower portion of the first source/drain contact wrapping around at least the first tapered sidewall of the first source/drain region and a lower portion of the second source/drain contact wrapping around at least the second tapered sidewall of the second source/drain region.

In one embodiment, cutting the first source/drain region and the second source/drain region further includes cutting a dielectric layer above the first and the second source/drain region, thereby creating a first dielectric cap on top of the first source/drain region and a second dielectric cap on top of the second source/drain region.

In another embodiment, the method further includes forming a dielectric filler between the first and the second source/drain region, wherein the dielectric filler includes a first portion and a second portion with the first portion being between the first and the second dielectric cap and the second portion being between the first and the second sacrificial sidewall spacer, and the first portion being directly on top of the second portion.

In yet another embodiment, forming the first and the second source/drain contact includes selectively removing the first and the second dielectric cap and the first and the second sacrificial sidewall spacer in a selective etching process to expose the first and the second source/drain region.

BRIEF DESCRIPTION OF THE DRAWINGS

The present invention will be understood and appreciated more fully from the following detailed description of embodiments of present invention, taken in conjunction with accompanying drawings of which:

FIGS. 1A and 1B to FIGS. 8A and 8B are demonstrative illustrations of cross-sectional views of a semiconductor structure in various steps of manufacturing thereof in accordance with several embodiments of a method of present invention; and FIG. 9 is a demonstrative illustration of a flow-chart of a method of manufacturing a semiconductor structure in accordance with embodiments of present invention.

Figures 1A, 1B:
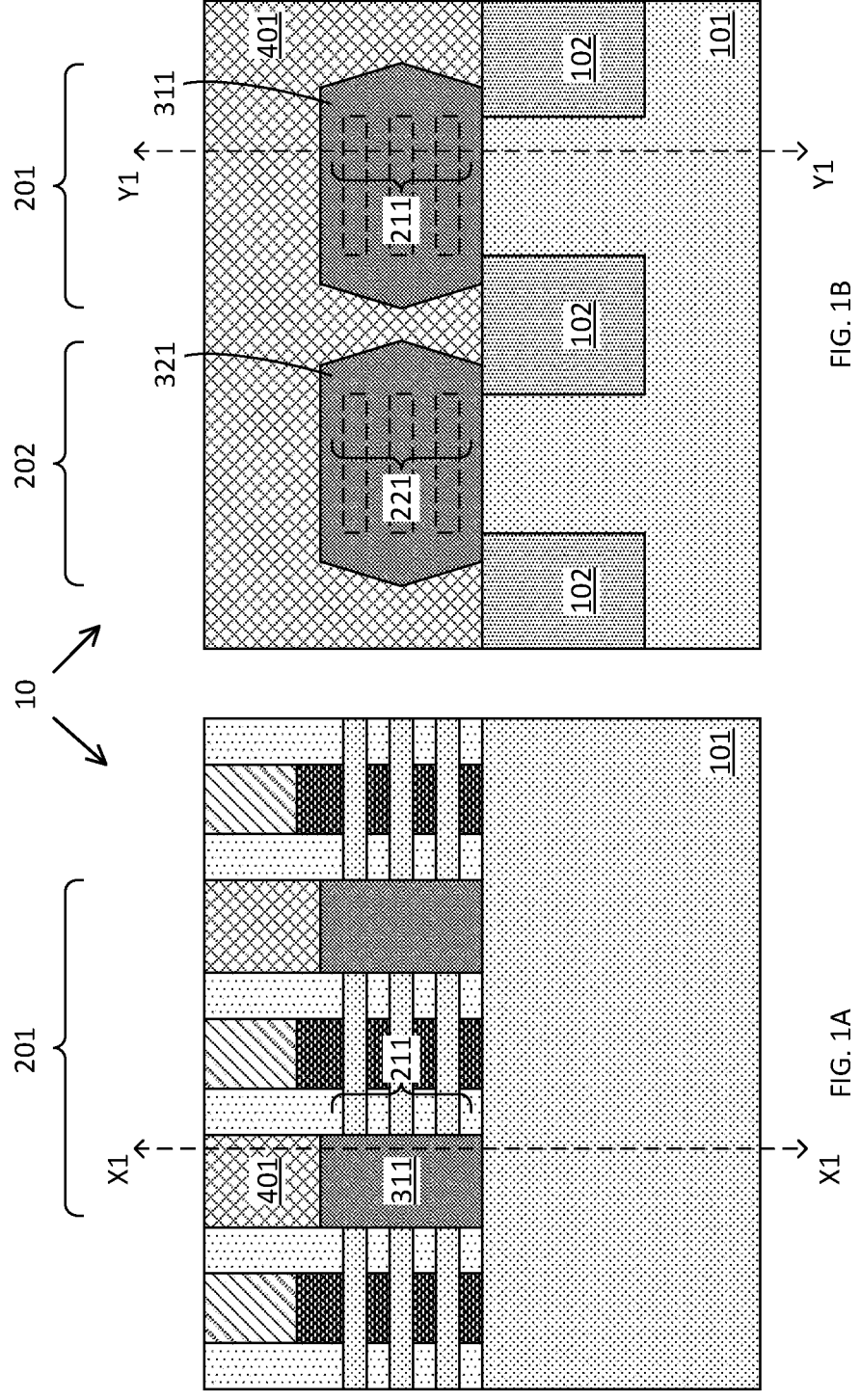

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A and 1B are demonstrative illustrations of cross-sectional views of a semiconductor structure in a step of manufacturing thereof according to one embodiment of present invention. For example, the semiconductor structure may be a transistor structure and may be illustrated here as a nanosheet transistor structure, for the purpose of explanation of embodiments of present invention. However, embodiments of present invention are not limited to nanosheet transistor structures. For example, embodiments of present invention may be applied to fin-type transistor structures, planar transistor structures, or any other types of transistor structures and may even be applied to other non-transistor type of semiconductor structures.

More specifically, FIG. 1A illustrates a cross-sectional view of a transistor structure 10 with the cross-section made perpendicular to a gate and along one or more nanosheets, from one source/drain region to another source/drain region of a transistor and FIG. 1B illustrates a cross-sectional view of the transistor structure 10 with the cross-section made across a source/drain region of the transistor, parallel to the gate and perpendicular to one or more nanosheets. More specifically, the cross-section illustrated in FIG. 1A may be made along a dashed line Y1-Y1 as is illustrated in FIG. 1B in a direction across the gate and along one or more nanosheets, and the cross-section illustrated in FIG. 1B may be made along a dashed line X1-X1 as is illustrated in FIG. 1A in a direction across the source/drain regions of a first transistor 201 and a second transistor 202.

Similarly, FIGS. 2A-2B to FIGS. 8A-8B illustrate cross-sectional reviews of the transistor structure 10, at various manufacturing steps, in a manner corresponding to FIGS. 1A-1B.

More particularly, embodiments of present invention provide forming the transistor structure 10 by providing a semiconductor substrate 101. The substrate 101 may include or may be formed to include one or more shallow-trench-isolations (STI's) 102 that may be used to separate and/or isolate one or more nanosheet transistors to be formed thereupon.

Embodiments of present invention may further provide forming one or more nanosheet transistors such as the first transistor 201 and the second transistor 202. The first transistor 201 may include a first stack of nanosheets 211 and the second transistor 202 may include a second stack of nanosheets 221. At a first end of the first and second stacks of nanosheets 211 and 221, the first transistor 201 may include a first source/drain region 311 and the second transistor 202 may include a second source/drain region 321. At a second end of the first and second stacks of nanosheets 211 and 221, the first transistor 201 may include another source/drain region and the second transistor 202 may also include another source/drain region (now shown). A dielectric layer 401 may be formed on top of the first source/drain region 311 and the second source/drain region 321. The dielectric layer 401 may also fill a gap between the first and the second source/drain region 311 and 321.

Figures 2A, 2B:
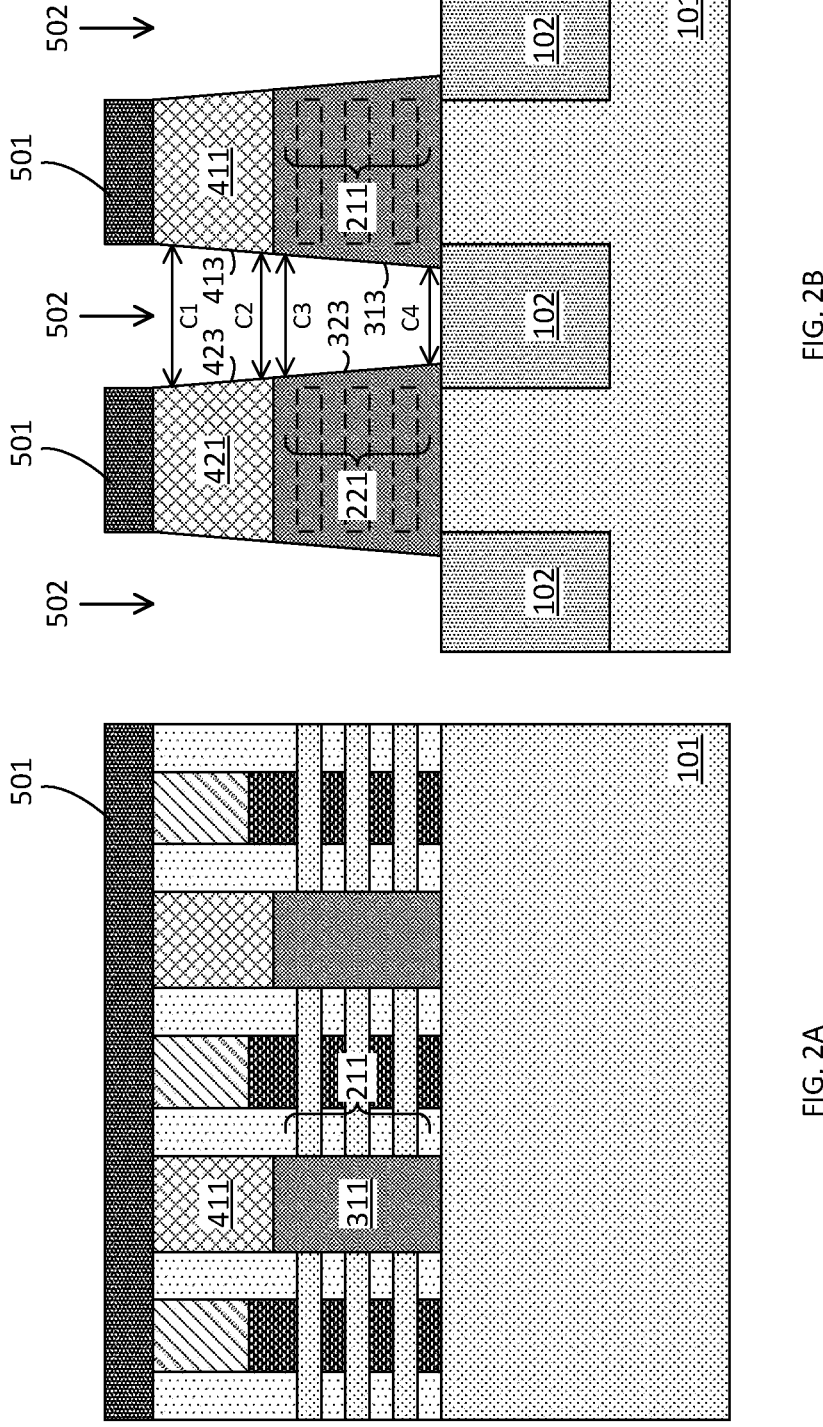

FIGS. 2A and 2B are demonstrative illustrations of cross-sectional views of a semiconductor structure in a step of manufacturing thereof according to one embodiment of present invention. More particularly, following the step illustrated in FIGS. 1A and 1B, embodiments of present invention provide forming a hard mask 501 on top of the dielectric layer 401 and performing a selective etching process to pattern the dielectric layer 401 into a first and a second dielectric cap 411 and 421 on top of the first and the second source/drain region 311 and 321 respectively. In patterning the dielectric layer 401 into the first and the second dielectric cap 411 and 421, embodiments of present invention create a first tapered sidewall 413 of the first dielectric cap 411 and a second tapered sidewall 423 of the second dielectric cap 421. The first and the second tapered sidewall 413 and 423 face each other to form an upper portion of an opening 502 between the first and the second source/drain region 311 and 321. The upper portion of the opening 502 has a width C1 at a top thereof and a width C2 at a bottom thereof, with C1 being larger or wider than C2. In one embodiment, the first and the second tapered sidewall 413 and 423 are flat and linearly tapered.

Embodiments of present invention further provide selectively etching sidewalls of the first source/drain region 311 to create a first tapered sidewall 313 and selectively etching sidewalls of the second source/drain region 321 to create a second tapered sidewall 323. The first tapered sidewall 313 faces the second tapered sidewall 323 and together the first and the second tapered sidewall 313 and 323 form a lower portion of the opening 502. The lower portion of the opening 502 has a width C3 at a top thereof and a width C4 at a bottom thereof, with C3 being larger or wider than C4. In one embodiment, the first and the second tapered sidewall 313 and 323 are linearly tapered.

In one embodiment, the first tapered sidewall 413 of the first dielectric cap 411 is coplanar with the first tapered sidewall 313 of the first source/drain region 311, and similarly the second tapered sidewall 423 of the second dielectric cap 421 is coplanar with the second tapered sidewall 323 of the second source/drain region 321. In other words, the first tapered sidewall 413 of the first dielectric cap 411 extends linearly into the first tapered sidewall 313 of the first source/drain region 311 to have a first common sidewall, and the second tapered sidewall 423 of the second dielectric cap 421 extends linearly into the second tapered sidewall 323 of the second source/drain region 321 to have a second common sidewall. The opening 502 expose the STI 102 embedded in the substrate 101.

Figures 3A, 3B:
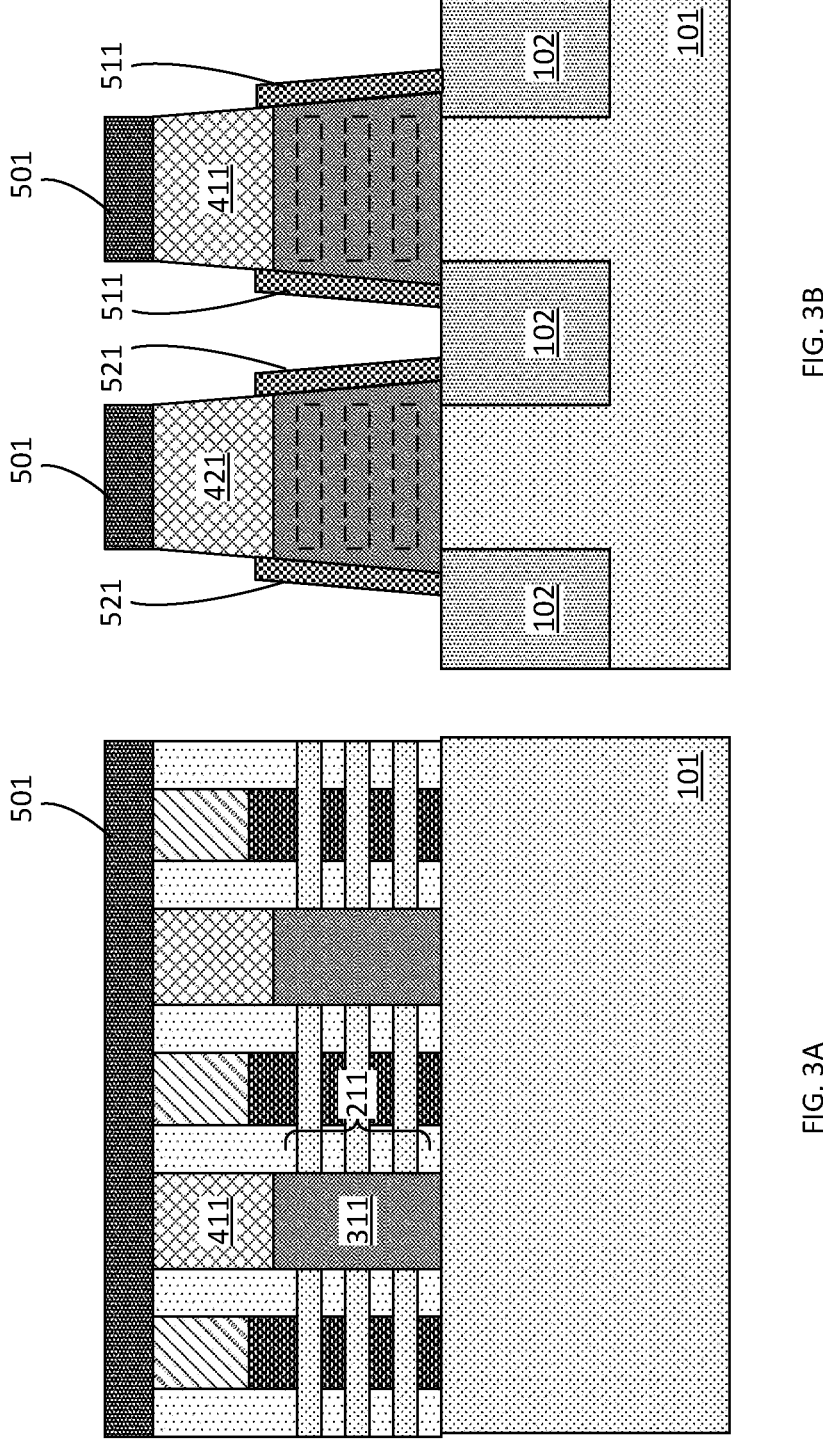

FIGS. 3A and 3B are demonstrative illustrations of cross-sectional views of a semiconductor structure in a step of manufacturing thereof according to one embodiment of present invention. More particularly, following the step illustrated in FIGS. 2A and 2B, embodiments of present invention provide forming a first sacrificial sidewall spacer 511 at the first tapered sidewall 313 of the first source/drain region 311 and a second sacrificial sidewall spacer 521 at the second tapered sidewall 323 of the second source/drain region 321. The first and the second sacrificial sidewall spacer 511 and 521 may be formed through, for example, an epitaxial growth process and may be formed conformally to have a substantially uniform thickness. In other words, the first and the second sacrificial sidewall spacer 511 and 521 may be conformal spacers. In one embodiment, the first and the second sacrificial sidewall spacer 511 and 521 may be formed to have a thickness ranging from about 4 nm to 15 nm and, by the nature of epitaxial growth process, may be formed to have portions thereof being formed above a level of the first and the second source/drain region 311 and 321.

Figure 4B:
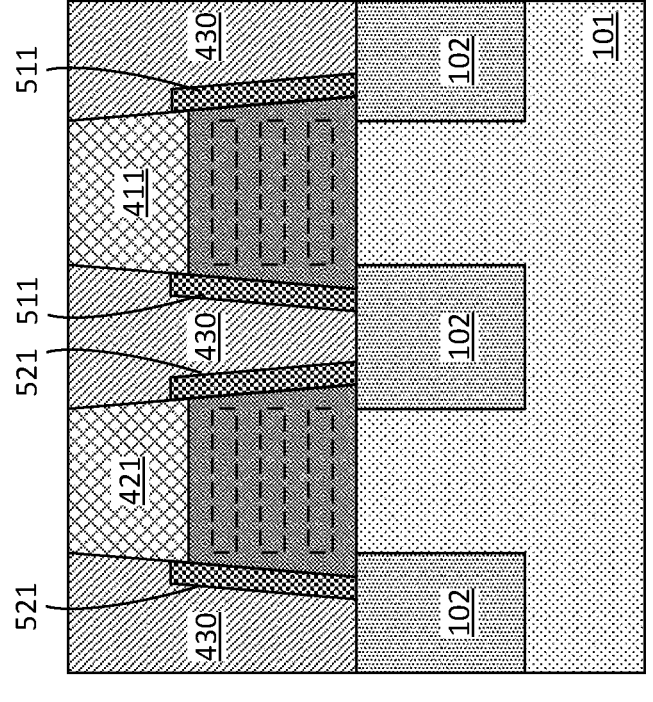
Figure 4A:
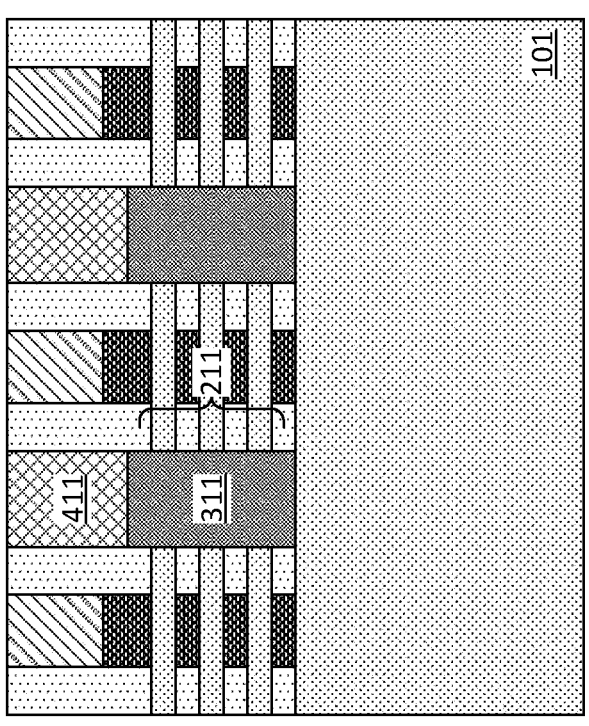

FIGS. 4A and 4B are demonstrative illustrations of cross-sectional views of a semiconductor structure in a step of manufacturing thereof according to one embodiment of present invention. More particularly, following the step illustrated in FIGS. 3A and 3B, embodiments of present invention provide filling a gap, such as filling the opening 502, between the first and the second source/drain region 311 and 321 with a dielectric filler 430 such that the dielectric filler 430 covers the first and the second sacrificial sidewall spacer 511 and 521. The dielectric filler 430 may fill the space between the first and the second dielectric cap 411 and 421 as well. Subsequently, a chemical-mechanic-polishing (CMP) process may be applied to remove the hard mask 501 thereby exposing the first and the second dielectric cap 411 and 421 that situate on top of the first and the second source/drain region 311 and 321.

Figures 5A, 5B:
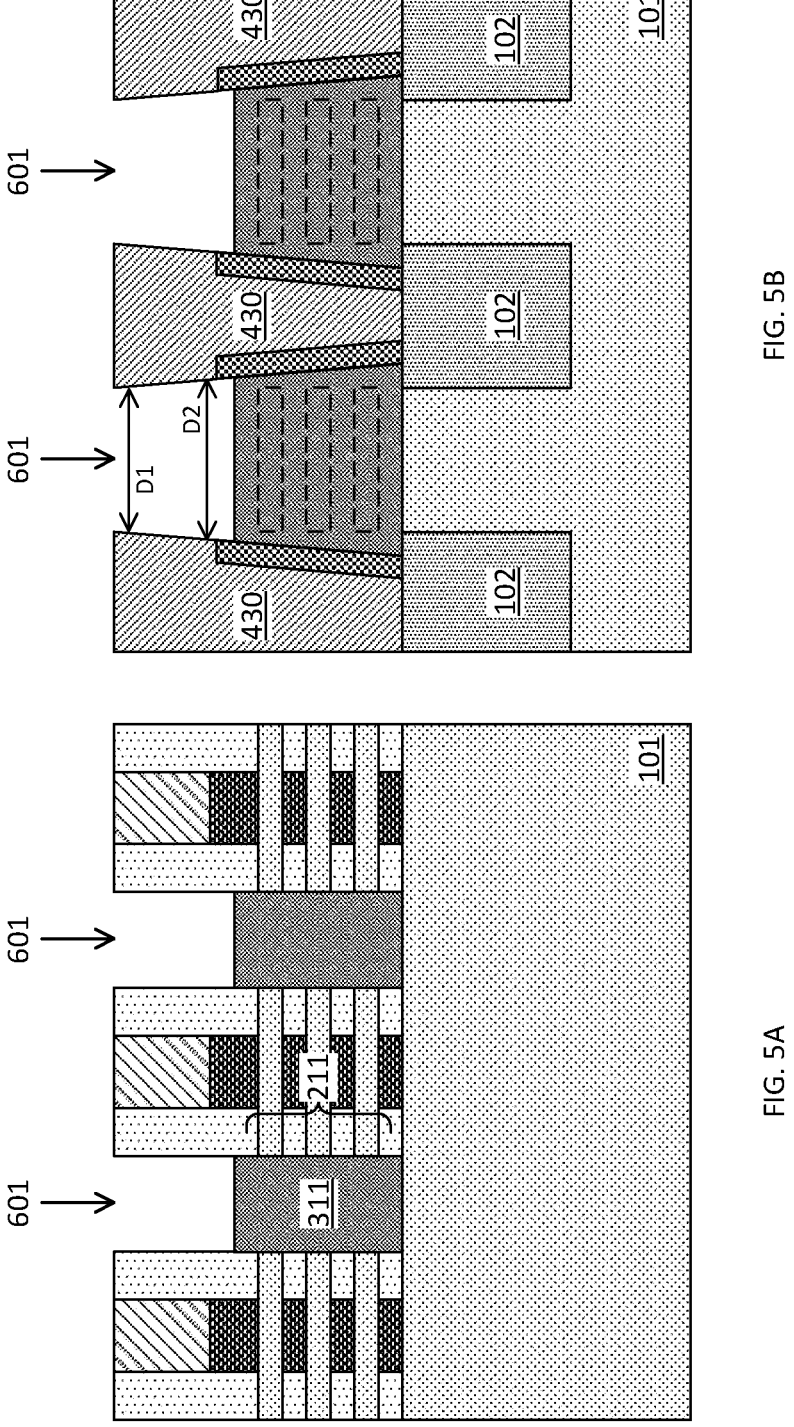

FIGS. 5A and 5B are demonstrative illustrations of cross-sectional views of a semiconductor structure in a step of manufacturing thereof according to one embodiment of present invention. More particularly, following the step illustrated in FIGS. 4A and 4B, embodiments of present invention provide removing the first and the second dielectric cap 411 and 421 in a selective etching process, relative to the surrounding dielectric filler 430 and relative to the first and the second source/drain region 311 and 321. The removal of the first and the second dielectric cap 411 and 421 may create one or more openings 601, and the one or more openings 601 may expose the portions of the first and the second sacrificial sidewall spacer 511 and 521 that are above the level of the first and the second source/drain region 311 and 321. The one or more openings 601 may have a shape resembling the shape of the first and the second dielectric cap 411 and 421 to have a width D1 at a top of the one or more openings 601 and a width D2 at a bottom of the one or more openings 601. Here, the width D1 may be narrower or smaller than the width D2.

Figures 6A, 6B:
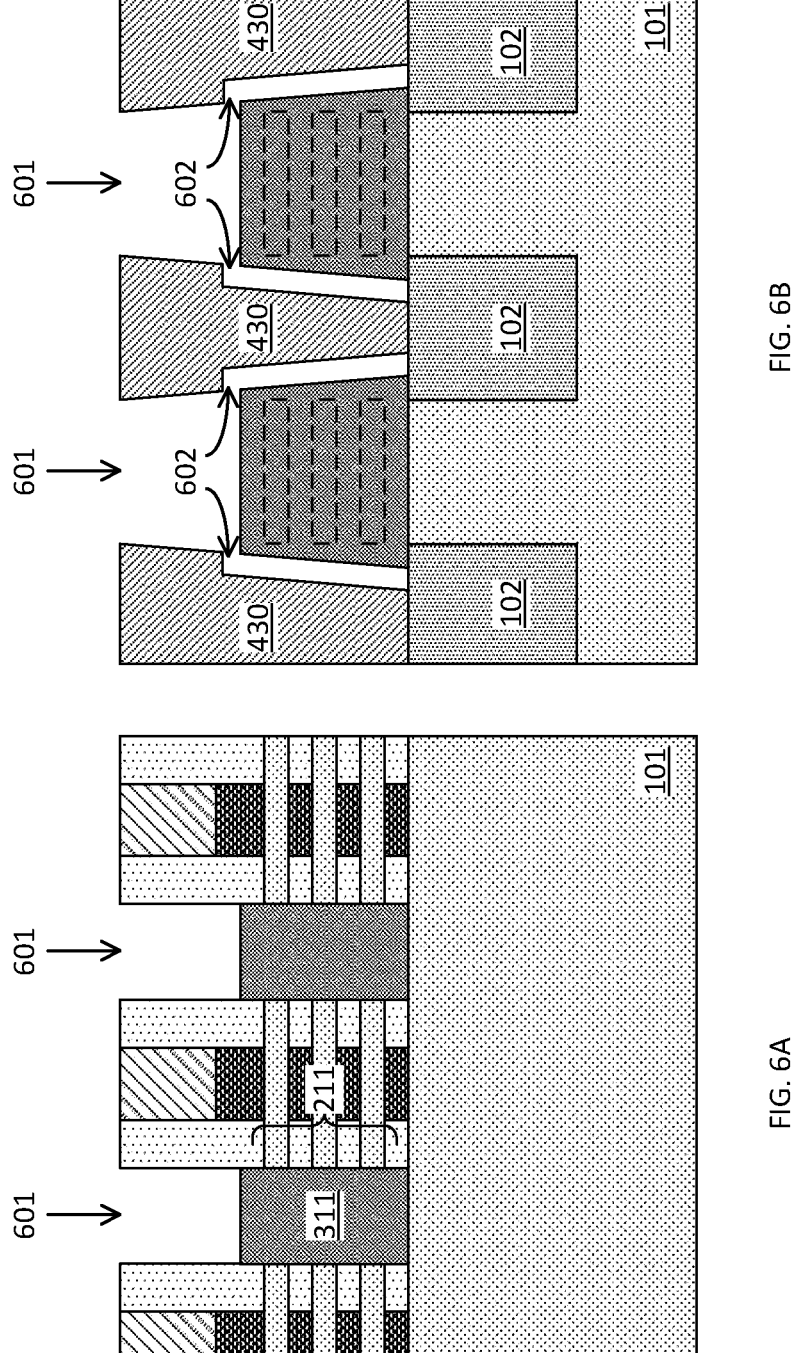

FIGS. 6A and 6B are demonstrative illustrations of cross-sectional views of a semiconductor structure in a step of manufacturing thereof according to one embodiment of present invention. More particularly, following the step illustrated in FIGS. 5A and 5B, embodiments of present invention provide continuing to selectively etch and remove the first and the second sacrificial sidewall spacer 511 and 521 at the first and the second tapered sidewall 313 and 323, respectively, of the first and the second source/drain region 311 and 321. The selective removal of the first and the second sacrificial sidewall spacer 511 and 521 may be made via the one or more openings 601, and through the exposed portions of the first and the second sacrificial sidewall spacer 511 and 521. The removal of the first and the second sacrificial sidewall spacer 511 and 521 creates one or more openings 602 next to the first and the second tapered sidewall 313 and 323 of the first and the second source/drain region 311 and 321. The one or more openings 602 may be surrounded by the dielectric filler 430.

Figure 7B:
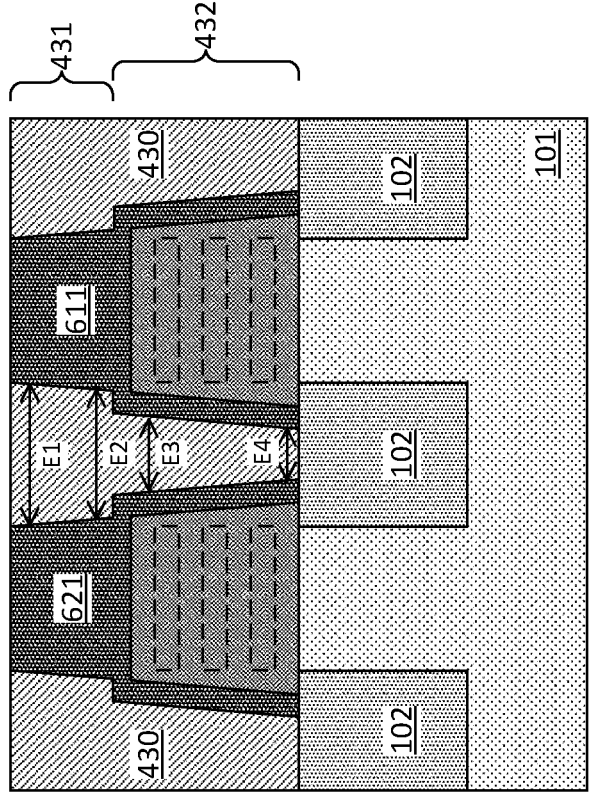
Figure 7A:
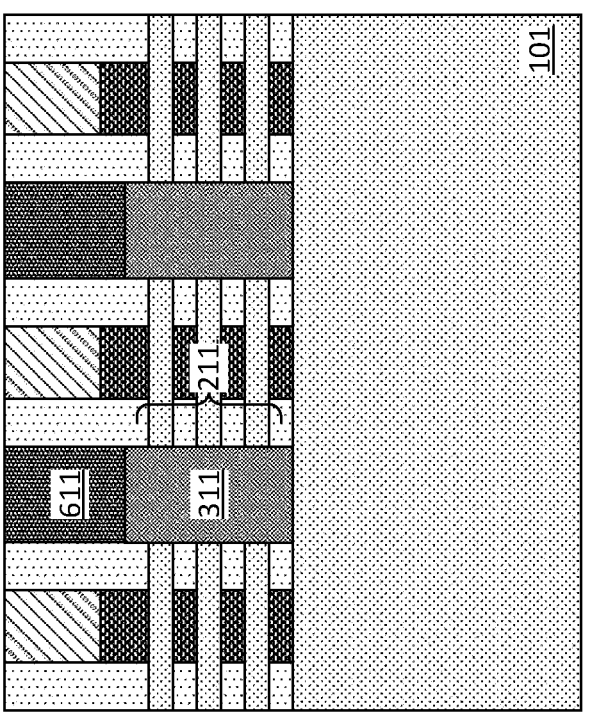

FIGS. 7A and 7B are demonstrative illustrations of cross-sectional views of a semiconductor structure in a step of manufacturing thereof according to one embodiment of present invention. More particularly, following the step illustrated in FIGS. 6A and 6B, embodiments of present invention provide depositing a conductive material in the one or more openings 602, via the one or more openings 601, and in the one or more openings 601 to form a first and a second source/drain contact 611 and 621. In one embodiment, the first and the second source/drain contact 611 and 621 may be silicide for improved contact resistance.

The first and the second source/drain contact 611 and 621 may have a bottom contact portion that wraps around at least top surfaces and the first and the second tapered sidewall 313 and 323 of the first and the second source/drain region 311 and 321, respectively. By wrapping around sidewalls and the top surfaces of the first and the second source/drain region 311 and 321, the first and the second source/drain contact 611 and 621 have larger contact surfaces to the first and the second source/drain region 311 and 321, resulting in reduced contact resistance and better performance of the first and the second transistor 201 and 202.

The first and the second source/drain contact 611 and 621 may have a top contact portion that is in a trapezoidal shape and directly above the bottom contact portion. For example, a width at a top of the top contact portion of the first and the second source/drain contact 611 and 621 may be narrower or smaller than a width at a bottom of the top contact portion of the first and the second source/drain contact 611 and 621.

In one embodiment, the dielectric filler 430 between the first and the second source/drain region 311 and 321 may have a first portion 431 and a second portion 432 with the first portion 431 being directly on top of the second portion 432. The first portion 431 of the dielectric filler 430 may have a width E1 at a top thereof and a width E2 at a bottom thereof with E1 being wider or larger than E2. The larger width at the top of the first portion 431 of the dielectric filler 430 enables forming source/drain contacts more densely without causing short between the source/drain contacts. The first portion 431 of the dielectric filler 430 may be between the top contact portions of the first and the second source/drain contact 611 and 621.

The second portion 432 of the dielectric filler 430 may have a width E3 at a top thereof and a width E4 at a bottom thereof with E3 being wider or larger than E4. The second portion 432 of the dielectric filler 430 may be between the lower contact portions of the first and the second source/drain contact 611 and 621.

At a first side of the dielectric filler 430, a sidewall of the first portion 431 of the dielectric filler 430 may be substantially parallel to a sidewall of the second portion 432 of the dielectric filler 430. In one embodiment, the width E2 at the bottom of the first portion is wider or larger than the width E3 at the top of the second portion.

Figure 8B:
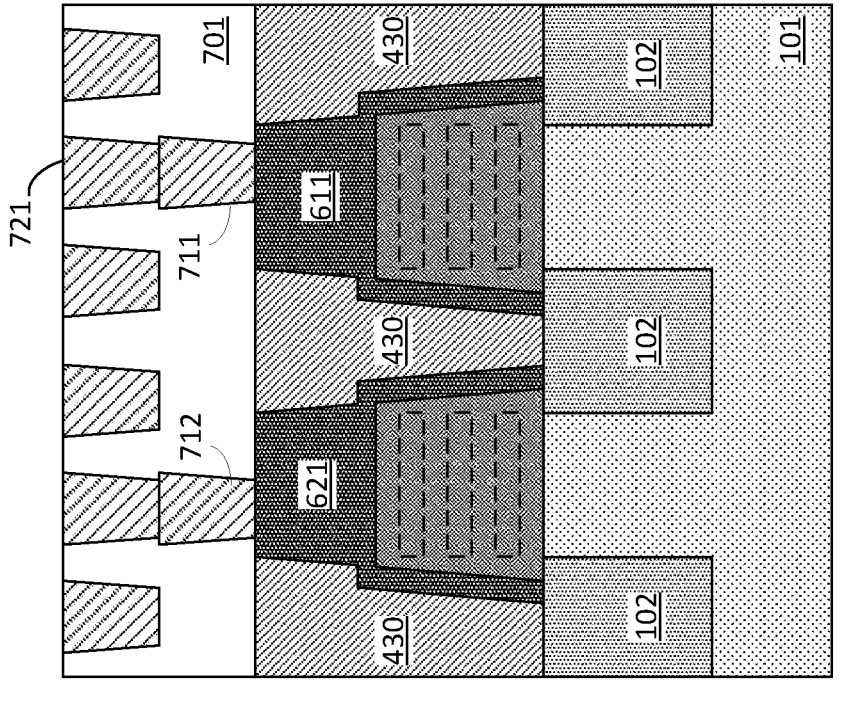
Figure 8A:
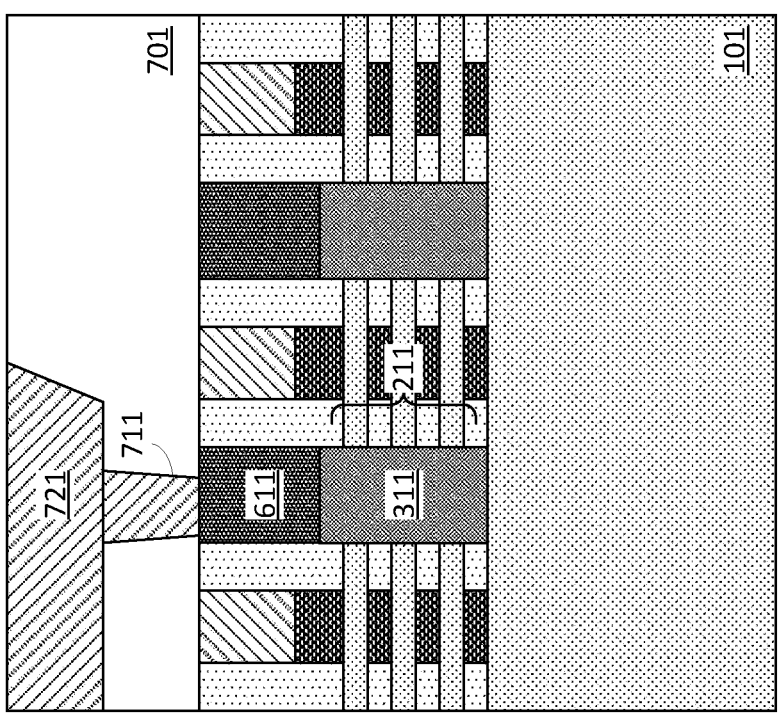

FIGS. 8A and 8B are demonstrative illustrations of cross-sectional views of a semiconductor structure in a step of manufacturing thereof according to one embodiment of present invention. More particularly, following the step illustrated in FIGS. 7A and 7B, embodiments of present invention provide forming one or more dielectric layers such as a dielectric layer 701 on top of the first and the second source/drain contact 611 and 621, and various vias and metal levels in the one or more dielectric layers to form middle-of-line (MOL) contacts and/or back-end-of-line (BEOL) structures. For example, embodiments of present invention may provide forming vias 711 and 712, which may be V0, and metal levels 721 above and in contact with the via 711.

FIG. 9 is a demonstrative illustration of a flow-chart of a method of manufacturing a semiconductor structure according to embodiments of present invention. The method includes (910) forming a first and a second source/drain region of a first and a second transistor, and forming a dielectric layer covering the first and the second source/drain region; (920) cutting the dielectric layer through a patterning process to form a first and a second dielectric cap, and cutting the first and the second source/drain region to form a first and a second tapered sidewall of the first and the second transistor respectively, wherein the first and the second dielectric cap being on top of the first and the second source/drain region respectively; (930) forming a first sacrificial sidewall spacer and a second sacrificial sidewall spacer at the first tapered sidewall of the first source/drain region and at the second tapered sidewall of the second source/drain region; (940) forming a dielectric filler in between the first and the second source/drain region to cover the first and the second sacrificial sidewall spacer and in between the first and the second dielectric cap; (950) selectively removing the first and the second dielectric cap and the first and the second sacrificial sidewall spacer to create openings that surrounds the first and the second source/drain region; (960) depositing a conductive material in the openings to form a lower contact portion of a first and a second source/drain contact, the lower contact portion wrapping around at least top surfaces and the first and the second tapered sidewalls of the first and the second source/drain region; (970) depositing the conductive material to form an upper contact portion of the first and the second source/drain contact directly on top of the bottom contact portion of the first and the second source/drain contact; and (980) forming various vias and metal levels to form middle-of-line (MOL) and back-end-of-line (BEOL) structures above the first and the second source/drain region.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
a first transistor having a first source/drain region and a second transistor having a second source/drain region;
a first source/drain contact around the first source/drain region and a second source/drain contact around the second source/drain region; and
a dielectric filler between the first source/drain contact and the second source/drain contact,
wherein the dielectric filler has a first portion and a second portion with the first portion being above the second portion, sidewalls of the first portion of the dielectric filler being linearly tapered to result in a width at a top of the first portion being larger than a width at a bottom of the first portion.

2. The semiconductor structure of claim 1, wherein sidewalls of the second portion of the dielectric filler are linearly tapered to result in a width at a top of the second portion being larger than a width at a bottom of the second portion.

3. The semiconductor structure of claim 2, wherein a sidewall of the first portion of the dielectric filler at a first side of the dielectric filler is substantially parallel to a sidewall of the second portion of the dielectric filler at the first side of the dielectric filler.

4. The semiconductor structure of claim 2, wherein the width at the bottom of the first portion of the dielectric filler is larger than the width at the top of the second portion of the dielectric filler.

5. The semiconductor structure of claim 1, wherein the first source/drain contact includes a bottom contact portion and a top contact portion directly on top of the bottom contact portion, the bottom contact portion wrapping around sidewalls and a top surface of the first source/drain region of the first transistor.

6. The semiconductor structure of claim 5, wherein a portion of the bottom contact portion contacting sidewalls of the first source/drain region of the first transistor is substantially conformal.

7. The semiconductor structure of claim 5, wherein the top contact portion has a width at a top thereof that is narrower than a width at a bottom thereof.

8. The semiconductor structure of claim 5, wherein the sidewalls of the first source/drain region of the first transistor are flat and tapered.

9. A method comprising:
forming a first source/drain region of a first transistor and a second source/drain region of a second transistor, the second source/drain region being next to the first source/drain region;
cutting the first source/drain region to create a first tapered sidewall and the second source/drain region to create a second tapered sidewall, the second tapered sidewall facing the first tapered sidewall;
forming a first sacrificial sidewall spacer at the first tapered sidewall and a second sacrificial sidewall spacer at the second tapered sidewall; and
forming a first source/drain contact of the first transistor and a second source/drain contact of the second transistor, a lower portion of the first source/drain contact wrapping around at least the first tapered sidewall of the first source/drain region and a lower portion of the second source/drain contact wrapping around at least the second tapered sidewall of the second source/drain region.

10. The method of claim 9, wherein cutting the first source/drain region and the second source/drain region further comprises cutting a dielectric layer above the first and the second source/drain region, thereby creating a first dielectric cap on top of the first source/drain region and a second dielectric cap on top of the second source/drain region.

11. The method of claim 10, further comprising forming a dielectric filler between the first and the second source/drain region, wherein the dielectric filler includes a first portion and a second portion with the first portion being between the first and the second dielectric cap and the second portion being between the first and the second sacrificial sidewall spacer, and the first portion being directly on top of the second portion.

12. The method of claim 11, wherein forming the first and the second source/drain contact comprises selectively removing the first and the second dielectric cap and the first and the second sacrificial sidewall spacer in a selective etching process to expose the first and the second source/drain region.

13. The method of claim 10, wherein the first dielectric cap and the first source/drain region have a first common sidewall and the second dielectric cap and the second source/drain region have a second common sidewall, the first and the second common sidewall taper linearly from a top to a bottom thereof.

14. The method of claim 11, wherein the first portion of the dielectric filler has a width at a top thereof that is larger than a width at a bottom thereof, the second portion of the dielectric filler has a width at a top thereof that is larger than a width at a bottom thereof, and the width at the bottom of the first portion of the dielectric filler is larger than the width at the top of the second portion of the dielectric filler.

15. A semiconductor structure comprising:
a first source/drain region of a first transistor and a second source/drain region of a second transistor;
a first source/drain contact over the first source/drain region and a second source/drain contact over the second source/drain region; and
a dielectric filler between the first and the second source/drain region, the dielectric filler isolating the first source/drain contact from the second source/drain contact,
wherein the dielectric filler has a first portion and a second portion with the first portion being on top of the second portion, the second portion being between a bottom contact portion of the first source/drain contact and a bottom contact portion of the second source/drain contact to have sidewalls that are linearly tapered, thereby having a width at a top thereof being larger than a width at a bottom thereof.

16. The semiconductor structure of claim 15, wherein sidewalls of the first portion of the dielectric filler being linearly tapered to result in a width at a top of the first portion being larger than a width at a bottom of the first portion, the width at the bottom of the first portion of the dielectric filler being larger than the width at the top of the second portion of the dielectric filler.

17. The semiconductor structure of claim 16, wherein, at a first side of the dielectric filler, a sidewall of the first portion of the dielectric filler is substantially parallel to a sidewall of the second portion of the dielectric filler.

18. The semiconductor structure of claim 15, wherein the bottom contact portion of the first source/drain contact wraps around sidewalls and a top surface of the first source/drain region of the first transistor.

19. The semiconductor structure of claim 18, wherein a portion of the bottom contact portion contacting sidewalls of the first source/drain region of the first transistor is substantially conformal.

20. The semiconductor structure of claim 19, wherein the first source/drain contact further includes a top contact portion directly on top of the bottom contact portion, the top contact portion has a width at a top and a width at a bottom, the width at the top of the top contact portion is narrower than the width at the bottom of the top contact portion.

\* \* \* \* \*